(12) United States Patent
Sato et al.

(10) Patent No.: US 8,957,304 B2
(45) Date of Patent: Feb. 17, 2015

(54) SHEET FOR SOLAR CELL ENCAPSULANT AND SOLAR CELL MODULE

(75) Inventors: Masanobu Sato, Tokyo (JP); Kazuyuki Oogi, Ichihara (JP)

(73) Assignee: Du Pont-Mitsui Polychemicals Co., Ltd., Tokyo (JP)

( * ) Notice: Subject to any disclaimer, the term of this patent is extended or adjusted under 35 U.S.C. 154(b) by 212 days.

(21) Appl. No.: 13/318,540

(22) PCT Filed: May 13, 2010

(86) PCT No.: PCT/JP2010/058126
§ 371 (c)(1),
(2), (4) Date: Nov. 2, 2011

(87) PCT Pub. No.: WO2010/131716
PCT Pub. Date: Nov. 18, 2010

(65) Prior Publication Data
US 2012/0048354 A1 Mar. 1, 2012

(30) Foreign Application Priority Data
May 13, 2009 (JP) ................................. 2009-116857

(51) Int. Cl.
*H01L 31/048* (2014.01)
*C08L 33/10* (2006.01)
*C08L 23/06* (2006.01)
*C08L 23/08* (2006.01)

(52) U.S. Cl.
CPC ............. *C08L 23/06* (2013.01); *C08L 23/0815* (2013.01); *C08L 23/0853* (2013.01); *C08L 23/0869* (2013.01); *H01L 31/048* (2013.01); *C08L 2205/02* (2013.01); *Y02E 10/50* (2013.01)
USPC ........................................... 136/251; 525/208

(58) Field of Classification Search
USPC ........................................... 136/251; 525/208
See application file for complete search history.

(56) References Cited

U.S. PATENT DOCUMENTS

| 4,689,085 | A | * | 8/1987 | Plueddemann | .......... | 106/287.14 |
| 5,409,973 | A |  | 4/1995 | Bastioli et al. | | |
| 2005/0247402 | A1 |  | 11/2005 | Fujiki et al. | | |
| 2006/0014871 | A1 |  | 1/2006 | Toriumi et al. | | |
| 2009/0044853 | A1 | * | 2/2009 | Hoya et al. | ..................... | 136/251 |
| 2010/0269890 | A1 | * | 10/2010 | Koch et al. | ..................... | 136/251 |

FOREIGN PATENT DOCUMENTS

| EP | 0630939 | 12/1994 |
| EP | 1504895 | 2/2005 |
| JP | 01-207340 | 8/1989 |
| JP | 04-501136 | 2/1992 |
| JP | 04-311732 | 11/1992 |
| JP | 04-325531 | 11/1992 |
| JP | 4-325531 | 11/1992 |
| JP | 06-177412 | 6/1994 |
| JP | 2001-348465 | 12/2001 |
| JP | 2003046105 | 2/2003 |
| JP | 2006-032308 | 2/2006 |
| JP | 2008-257893 | 10/2008 |
| JP | 2009-004437 | 1/2009 |

OTHER PUBLICATIONS

Lotader AX8900 Fact Sheet (Sep. 2010).*
Lotader AX8840 Fact Sheet (Jul. 2004).*
Borealis Visico LE4421 Fact Sheet (date unavailable).*
Dow Corning Z-6030 Silane MSDS (revised Nov. 2012).*
Prasad, "A Quantitative Analysis of Low Density Polyethylene and Linear Low Density Polyethylene Blends by Differential Scanning Calorimetery and Fourier Transform Infrared Spectroscopy Methods," Polym. Eng. Sci., vol. 38, No. 12, pp. 1716-1728 (1998).*
International Search Report dated Jun. 8, 2010.
Corresponding German Office Action dated May 13, 2013, and the English Translation thereof.
Chinese Office Action dated Aug. 5, 2014 issued in the corresponding Chinese patent application No. 201080020247.X; Partial English translation thereof.

* cited by examiner

*Primary Examiner* — Ling Choi
*Assistant Examiner* — Catherine S Branch
(74) *Attorney, Agent, or Firm* — Rankin, Hill & Clark LLP

(57) ABSTRACT

A sheet for solar cell encapsulant including (A) an ethylene copolymer selected from 1a to 5a; and (B) an ethylene copolymer selected from 1b to 3b, the copolymer (A) having a melting point of 90° C. or higher and containing constituent unit derived from ethylene [1a: ethylene-vinyl acetate (VA) copolymer, 2a: ethylene-acrylate copolymer, 3a: high-pressure method low-density polyethylene, 4a: ethylene-α-olefin copolymer, 5a: ethylene-G(M)A copolymer other than the below-described 1b, 1b: ethylene-G(M)A copolymer, 2b: ethylene-VA-G(M)A copolymer, 3b: ethylene-acrylate-G (M)A copolymer]. In the ethylene copolymer (B), the total ratio of the constituent unit derived from glycidyl(meth)acrylate (G(M)A) is preferably from 2% to 30% by mass. As a result of this, crosslinking treatment is substantially unnecessary, and practical adhesion and adhesion stability are achieved without heat treatment for crosslinking.

20 Claims, No Drawings

SHEET FOR SOLAR CELL ENCAPSULANT AND SOLAR CELL MODULE

TECHNICAL FIELD

The invention relates to a sheet for solar cell encapsulant for fixing a solar cell element in a solar cell module, and a solar cell module including the sheet for solar cell encapsulant.

BACKGROUND ART

Under the circumstances of a recent rise in environmental problems, attention has been paid to hydroelectric power generation, wind power generation, and photovoltaic power generation as clean energy. Among these, photovoltaic power generation has seen a remarkable improvement in performance such as the power generation efficiency of solar cell modules, and an ongoing decrease in price, and national and local governments have worked on projects to promote the introduction of residential photovoltaic power generation systems. Thus, in recent years, the spread of photovoltaic power generation systems has advanced considerably.

By photovoltaic power generation, solar light energy is converted directly to electric energy using a semiconductor (solar cell element), such as a silicon cell. The performance of the solar cell element utilized there is deteriorated by contacting the outside air. Consequently, the solar cell element is sandwiched by an encapsulant or a protective film for providing buffering and prevention of contamination with a foreign substance or penetration of moisture. In order to efficiently apply sunlight to the solar cell element, the transparency of the encapsulant and protective film is required.

In consideration of these demands, with the intentions of improving the transparency of the sheet for solar cell encapsulant, the adhesion of the sheet for solar cell encapsulant to various members composing a solar cell module, and the appearance of the sheet, a protective sheet for solar cell module included an ethylene-vinyl acetate copolymer containing 20% to 40% by mass of vinyl acetate as the main polymer, a copolymer prepared from ethylene, vinyl acetate, and glycidyl (meth)acrylate as the secondary polymer, and an organic peroxide is disclosed (see, for example, Patent Document 1).

In addition, with the intention of improving heat resistance and durability of a sheet for solar cell encapsulant during long-term use in a natural environment, for example, a protective sheet for solar cell module, the protective sheet being molded from a composition included a copolymer containing an unsaturated carboxylate ester in place of a commonly used ethylene-vinyl acetate copolymer, is disclosed (see, for example, Patent Document 2).

Patent document 1: Japanese Patent Application Laid-Open (JP-A) No. 4-325531
Patent document 2: JP-A No. 4-311732

DISCLOSURE OF INVENTION

Problem to be Solved by the Invention

If the ratio of vinyl acetate in the above-described ethylene-vinyl acetate copolymer is increased, the ethylene-vinyl acetate copolymer tend to show higher transparency and adhesion, but its moisture permeability also increases. Therefore, the copolymer may have poor adhesion to the transparent protective material and back sheet, according to the type of the top transparent protective material, which is arranged on the side at which sunlight is incident, the type of the back sheet, adhesion conditions, and use environment for the solar cell. In order to solve the problems due to moisture permeability, a back sheet with high moisture resistance is used, or the circumference of the module is sealed (encapsulated) by butyl rubber or the like having high moisture resistance. Therefore, if a sheet for solar cell encapsulant having higher moisture resistance is provided, the necessity for moisture-proof measures will be reduced, and longer durability is expected.

Both of the above-described protective sheet for solar cell module composed of an ethylene-vinyl acetate copolymer disclosed in Patent Document 1 and the protective sheet for solar cell module composed of a copolymer containing an unsaturated carboxylate ester disclosed in Patent Document 2 contain an organic peroxide needs to be crosslinked and require a crosslinking process. Therefore, the production of the solar cell module is time-consuming, and thus the productivity should be improved. In order to improve the productivity, the crosslinking time must be reduced, or the sheet must be in the form which requires substantially no crosslinking process.

In view of the above-described circumstances, the invention has been accomplished with the intention of solving the above-described problems.

Under the above-described circumstances, there is a need for a sheet for solar cell encapsulant which requires substantially no crosslinking treatment, and achieves adhesion and adhesion stability suitable for practical use without heat treatment for crosslinking (particularly adhesion to resin back sheets such as a polyester sheet). There is also a need for a solar cell module which achieves higher stability of the battery performance, higher durability, and higher productivity than prior art.

Means for Solving the Problem

Specific means for accomplishing the above-described objects are as follows.

<1> A sheet for solar cell encapsulant including:

(A) at least one ethylene copolymer selected from the group consisting of the following (1a) to (5a), the ethylene copolymer having a melting point of 90° C. or higher and containing a constituent unit derived from ethylene;

(B) at least one ethylene copolymer selected from the group consisting of the following (1b) to (3b) (wherein the total content ratio of the constituent unit derived from glycidyl (meth)acrylate is preferably from 2% to 30% by mass);

(Ethylene Copolymer (A))

(1a) an ethylene-vinyl acetate copolymer wherein the upper limit of the content ratio of the constituent unit derived from vinyl acetate is 15% by mass, and the lower limit is not particularly limited, but 0.5% by mass or more, preferably 1% by mass or more, and particularly preferably 5% by mass or more from the point of developing the performance of the ethylene-vinyl acetate copolymer;

(2a) an ethylene-acrylate copolymer wherein the upper limit of the content ratio of the constituent unit derived from acrylate is 15% by mass, and the lower limit is not particularly limited, but 0.5% by mass or more, and preferably 1% by mass or more, from the point of developing the performance of the ethylene-acrylate copolymer;

(3a) a high-pressure method low-density polyethylene (4a) an ethylene-α-olefin copolymer having a density of 0.895 g/cm$^3$ or more;

(5a) an ethylene-glycidyl (meth)acrylate copolymer other than the following (1b) of the ethylene copolymer (B);

(Ethylene Copolymer(B))

(1b) an ethylene-glycidyl (meth)acrylate copolymer;

(2b) an ethylene-vinyl acetate-glycidyl (meth)acrylate copolymer wherein the upper limit of the content ratio of the constituent unit derived from vinyl acetate is 30% by mass, and the lower limit is not particularly limited, but 0.1% by mass or more, preferably 0.5% by mass or more, and even more preferably 1% by mass or more from the point of developing the performance of the ethylene-vinyl acetate-glycidyl (meth)acrylate copolymer;

(3b) an ethylene-acrylate-glycidyl (meth)acrylate copolymer wherein the content ratio of the constituent unit derived from acrylate is 30% by mass or less, and the lower limit is not particularly limited, but 0.1% by mass or more, preferably 0.5% by mass or more, and even more preferably 1% by mass or more from the point of developing the performance of the ethylene-acrylate-glycidyl (meth)acrylate copolymer.

<2> The sheet for solar cell encapsulant as described in <1>, wherein the ethylene copolymer (A) and the ethylene copolymer (B) have a melt flow rate (JIS K7210-1999, 190° C., load of 2160 g) of from 0.1 g/10 minutes to 50 g/10 minutes.

<3> The sheet for solar cell encapsulant as described in <1> or <2>, which further includes at least one selected from the group consisting of a copolymer (C) obtained by copolymerization of at least an α-olefin and an ethylenically unsaturated silane compound (including those obtained by direct copolymerization of at least an α-olefin and an ethylenically unsaturated silane compound, and those obtained by graft polymerization of at least a homopolymer or copolymer containing an α-olefin with an ethylenically unsaturated silane compound or its condensate), and the silane coupling agent (D).

<4> The sheet for solar cell encapsulant as described in <3>, wherein the copolymer (C) further comprises a constituent unit derived from at least one of vinyl acetate or acrylate.

<5> The sheet for solar cell encapsulant as described in any one of the above <1> to <4>, wherein the ethylene-α-olefin copolymer (4a) of the ethylene copolymer (A) is an ethylene-propylene copolymer, an ethylene-1-butene copolymer, an ethylene-4-methyl-1-pentene copolymer, or an ethylene-1-hexene copolymer.

<6> The sheet for solar cell encapsulant as described in any one of the above <3> to <5>, wherein the α-olefin of the copolymer (C) is at least one of ethylene, propylene, 1-butene, isobutylene, 1-pentene, 2-methyl-1-butene, 3-methyl-1-butene, 1-hexene, 1-heptene, 1-octene, 1-nonene, or 1-decene.

<7> The sheet for solar cell encapsulant as described in any one of the above <3> to <6>, wherein the ethylenically unsaturated silane compound is selected from vinylsilane and (meth)acryloxysilane.

<8> The sheet for solar cell encapsulant as described in any one of the above <3> to <7>, wherein the ethylenically unsaturated silane compound is vinyltrimethoxysilane or γ-methacryloxypropyltrimethoxysilane.

<9> A solar cell module including at least a substrate at which sunlight is incident, a solar cell element, and the sheet for solar cell encapsulant as described in any one of the above <1> to <8>.

Effect of the Invention

According to the invention, there is provided a sheet for solar cell encapsulant which requires substantially no crosslinking treatment, and achieves adhesion and adhesion stability suitable for practical use without heat treatment for crosslinking (particularly adhesion to a resin back sheet such as a polyester sheet). Also provided is a solar cell module which achieves higher stability of the battery performance, higher durability, and higher productivity than prior art.

BEST MODE FOR CARRYING OUT THE INVENTION

The sheet for solar cell encapsulant of the invention and the solar cell module including the same are described below in detail.

The sheet for solar cell encapsulant of the invention includes (A) at least one ethylene-based polymer selected from the below-described specific polymers (1a to 5a), the ethylene-based polymer having a melting point of 90° C. or higher and containing the constituent unit derived from ethylene (ethylene copolymer (A); hereinafter may be referred to as component A); and (B) at least one selected from the below-described specific polymers (1b to 3b) (ethylene copolymer (B); hereinafter may be referred to as component B). The component B is preferably an ethylene copolymer wherein the content ratio of the constituent unit derived from glycidyl (meth)acrylate is from 2% to 30% by mass.

When the sheet for solar cell encapsulant has the above-described structure, it achieves higher adhesion and adhesion stability in comparison with a prior art sheet for solar cell encapsulant composed of a ethylene-vinyl acetate-based copolymer, and particularly a back sheet such as a polyester sheet used as a protective material made of resin is improved. In addition, the sheet for solar cell encapsulant does not require crosslinking for achieving heat resistance, different from a prior art sheet for solar cell encapsulant composed of an ethylene-vinyl acetate-based copolymer, and thus allows the production of solar cell modules in a shorter time.

—Component (A)—

The ethylene copolymer having a melting point of 90° C. or higher as the component (A) composing the sheet for solar cell encapsulant of the invention is selected from the ethylene-vinyl acetate copolymer (1a), ethylene-acrylate copolymer (2a), high-pressure method low-density polyethylene (3a), and ethylene-α-olefin copolymer (4a).

The ethylene copolymer (A) may be used the ethylene-glycidyl (meth)acrylate copolymer (5a) other than the ethylene-glycidyl (meth)acrylate copolymer (1b) defined as the ethylene copolymer (B).

Though the ethylene copolymer (A) includes ethylene copolymers having a melting point of 90° C. or higher, from the viewpoints of adhesion, transparency, and flexibility of the sheet for solar cell encapsulant, it is not preferred to use ethylene copolymers having constituent unit derived from glycidyl (meth)acrylate (for example, the content ratio is more than 30% by mass).

The "ethylene copolymer" of the component (A) is composed mainly of constituent unit derived from ethylene. Further, "composed mainly of" means that the ratio of the "constituent unit derived from ethylene" is 85% by mass or more, preferably 88% by mass or more, based on all the constituent unit. The ethylene copolymer may further contain other monomer units other than ethylene (for example, vinyl acetate, and acrylate).

In the ethylene-vinyl acetate copolymer (1a) of the component (A), the content ratio of the constituent unit derived from vinyl acetate is 15% by mass or less. When the content ratio of the constituent unit derived from vinyl acetate in the ethylene-vinyl acetate copolymer is 15% by mass or less, the sheet for solar cell encapsulant has low moisture permeability, so that the content ratio of the constituent unit derived from vinyl acetate is preferably lower. More specifically, the content ratio of the constituent unit derived from vinyl acetate is more preferably 14% by mass or less, and even more preferably 12% by mass or less. The lower limit of the content ratio of the constitutional unit derived from vinyl acetate is 0.5% by mass or more, preferably 1% by mass or more, and particularly preferably 5% by mass or more.

On the other hand, the content ratio of the constituent unit derived from ethylene in the ethylene-vinyl acetate copolymer of the component (A) is preferably from 99.5% to 85% by mass, more preferably from 99% to 86% by mass, and particularly preferably from 95% to 88% by mass. When the content ratio of the constituent unit derived from ethylene is within the above-described range, the copolymer has high heat resistance.

Hereinafter "vinyl acetate" and "the content ratio of the constituent unit derived from vinyl acetate" may be abbreviated as VA and VA content, respectively.

The high-pressure method low-density polyethylene (3a) is commercially available as a long chain branched polyethylene obtained by radical polymerization of ethylene under high pressure.

In the ethylene-acrylate copolymer (2a) of the component (A), the content ratio of the constituent unit derived from acrylate is 15% by mass or less. When the content ratio of the constituent unit derived from acrylate in the ethylene-acrylate copolymer is 15% by mass or less, the sheet for solar cell encapsulant has low moisture permeability, so that the content ratio of the constituent unit derived from acrylate is preferably lower. More specifically, the content ratio of the constituent unit derived from acrylate is more preferably 14% by mass or less, and even more preferably 12% by mass or less. The lower limit of the content ratio of the constituent unit derived from acrylate is 0.1% by mass or more, preferably 0.5% by mass or more, and even more preferably 1% by mass or more.

On the other hand, in the ethylene-acrylate copolymer, the content ratio of the constituent unit derived from ethylene is preferably from 99.9% to 85% by mass, more preferably from 99.5% to 86% by mass, and even more preferably from 99% to 88% by mass. When the constituent unit derived from ethylene is within the above-described range, the copolymer has high heat resistance.

Examples of acrylates composing the ethylene-acrylate copolymer (2a) include (meth)acrylates such as methyl acrylate, ethyl acrylate, isobutyl acrylate, n-butyl acrylate, 2-ethylhexyl acrylate, methyl methacrylate, and isobutyl methacrylate.

The ethylene-vinyl acetate copolymer, the ethylene-acrylate copolymer, and the high-pressure method low-density polyethylene may be prepared by a known high-pressure autoclave process or tubular process.

In the ethylene-α-olefin copolymer (4a) of the component (A), the content ratio of the constituent unit derived from α-olefin having 3 to 20 carbon atoms is preferably 5 mol % or more, and more preferably 10 mol % or more, taking the content of all the constituent unit (monomer units) composing the copolymer as 100 mol %. When the content ratio of the constituent unit derived from α-olefin is within the above-described range, the sheet for solar cell encapsulant has high transparency and bleed resistance. In particular, in consideration of the flexibility of the sheet for solar cell encapsulant, the content ratio of the constituent unit derived from α-olefin in the polymer is preferably 15 mol % or more. The upper limit is less than 50 mol %, preferably 40 mol % or less, and particularly preferably 30 mol % or less.

Specific examples of the α-olefine having 3 to 20 carbon atoms include linear α-olefins such as propylene, 1-butene, 1-pentene, 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, 1-nanodecene, and 1-eicosene; and branched α-olefins such as 3-methyl-1-butene, 3-methyl-1-pentene, 4-methyl-1-pentene, 2-ethyl-1-hexene, and 2,2,4-trimethyl-1-pentene. These compounds may be used in combination of two or more thereof.

In particular, from the viewpoint of versatility (cost, mass productivity, or availability), the number of carbon atoms of the α-olefine is preferably from 3 to 10, and more preferably from 3 to 8.

The ethylene-α-olefin copolymer is preferably an ethylene-propylene copolymer, an ethylene-1-butene copolymer, an ethylene-4-methyl-1-pentene copolymer, or an ethylene-1-hexene copolymer. In these ethylene-α-olefin copolymers, the content of the constituent unit derived from ethylene is 50 mol % or more.

In these copolymers, the ratio of the constituent unit derived from α-olefin is preferably 5 mol % or more, and more preferably 10 mol % or more, taking the total amount of the constituent unit (monomer units) composing the respective copolymers as 100 mol %.

In the sheet for solar cell encapsulant, the ethylene-α-olefin copolymer may be used alone or in combination of two or more thereof.

The ethylene-α-olefin copolymer (4a) having the above-described properties may be produced by, for example, a slurry polymerization process, a solution polymerization process, a bulk polymerization process, or a vapor phase polymerization process using a metallocene-based catalyst. Examples of the catalyst include the metallocene-based catalysts described in, for example, JP-A Nos. 58-19309, 60-35005, 60-35006, 60-35007, 60-35008, 61-130314, 3-163088, 4-268307, 9-12790, 9-87313, 10-508055, 11-80233, and Japanese Patent Application National Publication (Laid-Open) No. 10-508055. Particularly preferred examples of the production process using a metallocene-based catalyst include the process described in European Patent Application No. 1211287.

The ethylene-α-olefin copolymer may be produced by copolymerization of ethylene with other α-olefin in the presence of a metallocene-based catalyst, a vanadium-based catalyst prepared from a soluble vanadium compound and organic aluminum halide, or a metallocene-based catalyst prepared from a metallocene compound such as a zirconium compound coordinated with, for example, a cyclopentadienyl group, and an organic aluminum oxy compound.

The ethylene-α-olefin copolymer produced by the above-described production process is substantially linear and rigid.

When the ethylene-α-olefin copolymer (4a) is used as the component (A), the density of the ethylene-α-olefin copolymer (4a) is 0.895 g/cm$^3$ or more. When the density of the ethylene-α-olefin copolymer is 0.895 g/cm$^3$ or more, the copolymer has high heat resistance, and thus the sheet for solar cell encapsulant of the invention mounted in a solar cell module maintains its function as an encapsulant even in a harsh external environment. The even more preferred embodiment of the ethylene-α-olefin copolymer is a linear ultralow or low-density polyethylene having a density of 0.895 g/cm$^3$ or more, produced in the presence of a Ziegler-Natta catalyst or a metallocene catalyst. There are various definitions for "ultralow-density" and "low-density", but herein "ultralow-density means a density of 0.895 g/cm$^3$ or more and less than 0.910 g/cm$^3$, and "low-density means a density of from 0.910 g/cm$^3$ to 0.930 g/cm$^3$". When the ethylene-α-olefin copolymer as the component (A) is ultralow or low-density polyethylene, it achieves high heat resistance and high adhesion. Therefore, when the sheet for solar cell encapsulant containing the ethylene-α-olefin copolymer is mounted in a solar cell module, the sheet for solar cell encapsulant achieves high adhesion to the substrate, the back sheet or solar cell array, and is durable for use in a harsh external environment.

Among the above-described ethylene copolymers, in order to further reduce the moisture permeability of the sheet for solar cell encapsulant, the ethylene copolymer (A) preferably contains at least one of the ethylene-vinyl acetate copolymer (1a) wherein the content ratio of the constituent unit derived from vinyl acetate is 15% by mass or less, or the ethylene-acrylate copolymer (2a) wherein the content ratio of the constituent unit derived from acrylate is 15% by mass or less.

In addition, the component (A) is more preferably the ethylene-vinyl acetate copolymer (1a) or ethylene-acrylate copolymer (2a), thereby improving adhesion to glass and polyester sheets composing the solar cell module.

The ethylene copolymer (A) has a melting point of 90° C. or higher. If the melting point is lower than 90° C., the sheet has insufficient heat resistance. For the same reason as above, the melting point is preferably 94° C. or higher. The upper limit is preferably 120° C.

In the invention, the melting point of the respective copolymers is measured by DSC (differential scanning calorimetry).

The ethylene copolymer of the component (A) may be one kind or two or more selected from the (1a) to (5a).

The content of the ethylene copolymer (A) in the sheet for solar cell encapsulant is preferably from 40% to 90% by mass, and more preferably from 50% to 80% by mass, based on the total mass of the sheet. When the content of the ethylene copolymer is within the above-described range, the sheet has higher heat resistance.

—Component (B)—

The ethylene copolymer of the component (B) composing the sheet for solar cell encapsulant of the invention (ethylene copolymer (B)) is selected from the ethylene-glycidyl (meth) acrylate copolymer (1b), ethylene-vinyl acetate-glycidyl (meth)acrylate copolymer (2b), and ethylene-acrylate-glycidyl (meth)acrylate copolymer (3b). The total content ratio of the constituent unit derived from glycidyl (meth)acrylate in the component (B) is preferably from 2% to 30% by mass, and more preferably from 3% to 25% by mass.

When the total content ratio of the constituent unit derived from glycidyl (meth)acrylate is 2% by mass or more, the sheet for solar cell encapsulant achieves higher adhesion to the components of the solar cell module (for example, solar cell elements and substrate), and when the ratio is 30% by mass or less, crosslinking is moderate and higher adhesion are achieved, and the sheet for solar cell encapsulant has better transparency and flexibility.

The term "glycidyl (meth)acrylate" means at least one of glycidyl methacrylate or glycidyl acrylate. Hereinafter "glycidyl methacrylate" and "the content ratio of the constituent unit derived from glycidyl methacrylate" may be abbreviated as GMA and GMA content, respectively.

In the ethylene copolymer (B), the total content ratio of the constituent unit derived from glycidyl (meth)acrylate is preferably from 2% to 30% by mass. The ethylene copolymer (B) includes ethylene copolymer having a melting point of 90° C. or higher.

The "ethylene copolymer" in the component (B) is composed mainly of the constituent unit derived from ethylene, and "composed mainly of" means that the content of "the constituent unit derived from ethylene" is the highest among all the constituent unit. For example, when the copolymer is composed of constituent unit derived from ethylene, vinyl acetate, and glycidyl (meth)acrylate, the ratio of the constituent unit derived from ethylene is greater than the constituent unit derived from vinyl acetate and glycidyl (meth)acrylate.

At least one of the ethylene copolymer (B) is selected from the group consisting of the ethylene-glycidyl (meth)acrylate copolymer (1b), the ethylene-vinyl acetate-glycidyl (meth) acrylate copolymer (2b) wherein the content ratio of the constituent unit derived from vinyl acetate is 30% by mass or less, and the ethylene-acrylate-glycidyl (meth)acrylate copolymer (3b) wherein the content ratio of the constituent unit derived from acrylate is 30% by mass or less.

When the content ratios of the constituent unit derived from vinyl acetate or acrylate in the copolymers (2b) and (3b) are 30% by mass or less, the sheet for solar cell encapsulant may has low moisture permeability. The lower limit of the content ratio of the constituent unit derived from vinyl acetate or the constituent unit derived from acrylate is not particularly limited, but the lower limit is preferably 0.1% by mass or more, more preferably 0.5% by mass or more, and even more preferably 1% by mass or more. In addition, the content ratio of the constituent unit derived from vinyl acetate or the constituent unit derived from acrylate is preferably from 0.1% to 30% by mass, more preferably from 0.5% to 20% by mass, and particularly preferably from 1% to 20% by mass.

The ethylene copolymer (B) may be one kind or two kinds or more selected from the (1b) to (3b), the two kinds of the ethylene copolymers combined may be different in the copolymerization ratio or the like.

The content of the ethylene copolymer (B) in the sheet for solar cell encapsulant is preferably from 5% to 50% by mass, and more preferably from 8% to 30% by mass, taking the total amount with the ethylene copolymer (A) defined above as 100% by mass. When the content of the ethylene copolymer (B) is within the above-described range, transparency, flexibility, and processability are achieved, and adhesion and adhesion stability (in particular, adhesion to protective materials made of resin such as polyester or the like, for example a back sheet) are improved.

In addition, the sheet for solar cell encapsulant of the invention containing the components (A) and (B) has another advantages that it has a high melting point or softening point, and high heat resistance.

In the sheet for solar cell encapsulant of the invention containing the components (A) and (B), the total content of the constituent unit derived from glycidyl (meth)acrylate is not particularly limited as long as the total content is within the above-described range, but the total content is preferably from 0.1% to 10% by mass, more preferably from 0.3% to 5% by mass, and particularly preferably from 0.5% to 3% by mass, from the viewpoint of cost performance.

The components (A) and (B) composing the sheet for solar cell encapsulant of the invention preferably has a melt flow rate (JIS K7210-1999, 190° C., load of 2160 g; hereinafter may be abbreviated as MFR) of from 0.1 g/10 minutes to 50 g/10 minutes, more preferably from 0.5 g/10 minutes to 30 g/10 minutes, and particularly preferably from 1 g/10 minutes to 20 g/10 minutes. The use of the copolymer within this range facilitates processing into a sheet for solar cell encapsulant, and allows the production of a desired sheet. As a result of this, high adhesion is achieved, and unnecessary overflow is prevented when the sheet is mounted in a solar cell module.

The sheet for solar cell encapsulant of the invention may contain, in addition to the components (A) and (B), at least one selected from the group consisting of the copolymer (C) obtained by copolymerization of at least α-olefin with an ethylenically unsaturated silane compound (hereinafter may be referred to as the component (C)), and the silane coupling agent (D) (hereinafter may be referred to as the component (D)).

The component (C) contains, as the constituent unit of the copolymer, at least an α-olefin and an ethylenically unsaturated silane compound, and may further contain, as necessary, other constituent unit. Examples of the component (C) include those obtained by direct copolymerization of at least an α-olefin with an ethylenically unsaturated silane compound, those obtained by graft polymerization of at least a homopolymer or copolymer containing an α-olefin with an ethylenically unsaturated silane compound, and those obtained by condensation reaction between at least a homopolymer or copolymer containing an α-olefin and an ethylenically unsaturated silane compound.

More specific examples include a copolymer prepared by concurrent or sequential random copolymerization of one kind or two kinds or more α-olefins, one kind or two kinds or more of ethylenically unsaturated silane compounds, and optionally other constitutional unit in a desired reaction vessel under the condition of, for example, a pressure of 500 kg/cm$^2$ to 4000 kg/cm$^2$ and a temperature of 100° C. to 400° C., in the presence of a radical polymerization initiator and optionally a chain transfer agent.

Other examples include a copolymer prepared by concurrent or sequential polymerization of one kind or two kinds or more of α-olefins and optionally one kind or two kinds or more of other unsaturated monomers in a desired reaction vessel in the presence of a radical polymerization initiator and optionally a chain transfer agent, followed by graft copolymerization of the polyolefin polymer formed by the above polymerization with an ethylenically unsaturated silane compound or one or more initial condensates or condensates thereof.

Examples of the α-olefin in the copolymer (C) include ethylene and α-olefins having 3 to 20 carbon atoms listed in the explanation of the ethylene copolymer (A).

Among them, the α-olefin of the copolymer (C) is preferably ethylene, propylene, 1-butene, isobutylene, 1-pentene, 2-methyl-1-butene, 3-methyl-1-butene, 1-hexene, 1-heptene, 1-octene, 1-nonene, or 1-decene, and more preferably ethylene, propylene, or 1-butene, from the viewpoints of bleed resistance, processability, and cost.

The α-olefin in the copolymer (C) may be used alone or in combination of two or more thereof.

Examples of the ethylenically unsaturated silane compound in the copolymer (C) include vinylsilanes such as vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinylpropionyl oxysilane, vinyltriacetoxysilane, and vinyltricarboxysilane;

(meth)acryloxysilanes such as γ-methacryloxypropyltrimethoxysilane, γ-methacryloxypropylmethyldimethoxysilane, γ-acryloxypropyltrimethoxysilane, and γ-acryloxypropylmethyldimethoxysilane;

N-2(aminoethyl)-3-aminopropyltrimethoxysilane, N-2(aminoethyl)-3-aminopropyltriethoxysilane, N-2(aminoethyl)-3-aminopropyltrimethoxysilane, 3-aminopropyltrimethoxysilane, 3-aminopropyltriethoxysilane, N-phenyl-3-aminopropyltrimethoxysilane, N-phenyl-3-aminopropyltriethoxysilane, 3-methyltrimethoxysilyl-N-(1,3-dimethyl-butylidene)propylamine, 3-methyltrimethoxysilyl-N-(1,3-dimethyl-butylidene)propylamine, 2-(3,4epoxycyclohexyl)ethyltrimethoxysilane, 2-(3,4epoxycyclohexyl)ethyltriethoxysilane, 3-glycidoxypropyltrimethoxysilane, 3-glycidoxypropylmethyldiethoxysilane, N-2(aminoethyl)-3-aminopropylmethyldimethoxysilane, N-2(aminoethyl)-3-aminopropylmethyldiethoxysilane, 3-aminopropylmethyldimethoxysilane, 3-aminopropylmethyldiethoxysilane, N-phenyl-3-aminopropylmethyldimethoxysilane, and N-phenyl-3-aminopropylmethyldiethoxysilane.

Among them, vinylsilanes such as vinyltrimethoxysilane, (meth)acryloxysilanes such as γ-methacryloxypropyltrimethoxysilane, and alkoxysilanes having amino or epoxy groups such as N-2(aminoethyl)-3-aminopropylmethyldimethoxysilane, N-2(aminoethyl)-3-aminopropylmethyldiethoxysilane, 3-aminopropylmethyldimethoxysilane, and 3-aminopropylmethyldiethoxysilane are preferred, and vinylsilanes and (meth)acryloxysilanes are more preferred.

The ethylenically unsaturated silane compound in the copolymer (C) may be alone or in combination of two or more thereof.

Though the ethylenically unsaturated silane compound is selected from the compounds listed above, from the viewpoint of reactivity with α-olefin, vinylsilanes are preferred, and among the compounds listed above, vinyltrimethoxysilane and γ-methacryloxypropyltrimethoxysilane are particularly preferred.

The copolymer (C) may contain, in addition to the α-olefin and ethylenically unsaturated silane compound, other constituent unit such as the constituent unit derived from at least one selected from vinyl acetates, acrylates, and glycidyl (meth)acrylates. The copolymer may be produced by, for example, graft copolymerization of the component (A) and/or (B) with the ethylenically unsaturated silane compound. When the copolymer containing the third monomer is produced, as described above, of these constituent units, constituent unit derived from vinyl acetate is preferred, from the viewpoint of reactivity with the ethylenically unsaturated silane compound.

The method for condensing the constituent unit of the ethylenically unsaturated silane compound in the copolymer (C) may be dehydration condensation reaction or the like between the silanol groups of the silane compound composing the copolymer (C) using a silanol condensation catalyst, for example, metal carboxylates such as tin, zinc, iron, lead, and cobalt and the like, organometallic compounds such as esters and chelates of titanic acid, organic bases, inorganic acids, organic acids, and the like.

The content of the component (C) in the sheet for solar cell encapsulant is 15 parts by mass or less, preferably from 0.03 to 14 parts by mass, and particularly preferably from 0.1 to 12 parts by mass, based on the total amount of 100 parts by mass of the components (A) and (B) from the viewpoint of improving adhesion and processing stability during sheet molding. When the content of the component (C) is within the above-described range, the sheet for solar cell encapsulant shows higher adhesion to the protective material or solar cell element.

Examples of the silane coupling agent of the component (D) include γ-methacryloxypropyltrimethoxysilane, γ-methacryloxypropylmethyldimethoxysilane, γ-acryloxypropyltrimethoxysilane, γ-acryloxypropyl methyldimethoxysilane, N-(β-aminoethyl)-γ-aminopropyltrimethoxysilane, N-(β-aminoethyl)-γ-aminopropyl methyldimethoxysilane, γ-aminopropyltriethoxysilane, and γ-glycidoxypropyltrimethoxysilane.

Among them, the silane coupling agent (D) is preferably an alkoxysilane containing an amino group, from the viewpoint of improving adhesion, and stabilizing the lamination procedure with the substrate such as glass and the protective material such as a back sheet.

Examples of the alkoxysilane containing an amino group include aminotrialkoxysilanes such as 3-aminopropyltrimethoxysilane, 3-aminopropyltriethoxysilane, and N-(β-aminoethyl)-γ-aminopropyltrimethoxysilane; and aminodialkoxysilanes such as N-(β-aminoethyl)-γ-aminopropylmethyldimethoxysilane, N-(β-aminoethyl)-γ-aminopropylmethyldiethoxysilane, N-(β-aminoethyl)-γ-aminopropyldimethoxysilane, 3-aminopropylmethyldimethoxysilane, 3-aminopropylmethyldiethoxysilane, N-phenyl-3-aminopropylmethyldimethoxysilane, N-phenyl-3-aminopropylmethyldiethoxysilane, 3-methyldimethoxysilyl-N-(1,3-dimethyl-butylidene)propylamine, and 3-methyldimethoxysilyl-N-(1,3-dimethyl-butylidene)propylamine.

Among them, from the viewpoint of adhesion, 3-aminopropyltrimethoxysilane, 3-aminopropyltriethoxysilane, N-(β-aminoethyl)-γ-aminopropyltrimethoxysilane, N-(β-aminoethyl)-γ-aminopropylmethyldimethoxysilane, N-(β-aminoethyl)-γ-aminopropylmethyldiethoxysilane, N-(β-aminoethyl)-γ-aminopropyldimethoxysilane, 3-aminopropylmethyldimethoxysilane, and 3-aminopropylmethyldiethoxysilane are preferred, and 3-aminopropyltrimethoxysilane, N-(β-aminoethyl)-γ-aminopropyltrimethoxysilane, and N-(β-aminoethyl)-γ-aminopropylmethyldimethoxysilane are particularly preferred.

Trialkoxysilane is preferred because it further improves adhesion. Dialkoxysilanes are preferred because it maintains processability for sheet formation.

The alkoxysilanes may be used alone or in combination of two or more thereof.

The content of the silane coupling agent (D) in the sheet for solar cell encapsulant is 3 parts by mass or less, preferably from 0.03 to 3 parts by mass, and particularly preferably from 0.05 to 1.5 parts by mass, based on 100 parts by mass of the total amount of the components (A) and (B), from the point of effect of improving adhesion and achieving processing stability during sheet formation. When the content of the silane coupling agent is within the above-described range, the sheet for solar cell encapsulant achieves high adhesion to the protective material, solar cell element, or the like.

In order to prevent the deterioration of the sheet caused by exposure to ultraviolet, at least one of the components (A) or (B) preferably contains, for example, an ultraviolet absorber, a light stabilizer, an antioxidant, and the like.

Examples of the ultraviolet absorber include benzophenone-based ones such as 2-hydroxy-4-methoxybenzophenone, 2,2'-dihydroxy-4-methoxybenzophenone, 2-hydroxy-4-methoxy-2-carboxybenzophenone, and 2-hydroxy-4-n-octoxybenzophenone; benzotriazole-based ones such as 2-(2'-hydroxy-3',5'-di-t-butylphenyl)benzotriazole, 2-(2'-hydroxy-5-methylphenyl)benzotriazole, and 2-(2'-hydroxy-5-t-octylphenyl)benzotriazole; and salicylate-based ones such as phenyl salicylate and p-octylphenyl salicylate.

Examples of the light stabilizer include hindered amines

Examples of the antioxidant include various hindered phenol-based and phosphite-based ones.

Each content of the antioxidant, light stabilizer, and ultraviolet absorber may be normally 5 parts by mass or less, and preferably from 0.1 to 3 parts by mass, based on 100 parts by mass of the total amount of the components (A) and (B).

The sheet for solar cell encapsulant may contain, as necessary, additives such as a colorant, a light diffusing agent, and a flame retardant.

Examples of the colorant include pigments, inorganic compounds, and dyes. In particular, examples of white colorant include titanium oxide, zinc oxide, and calcium carbonate.

Examples of the light diffusing agent include inorganic spherical substances such as glass beads, silica beads, silicon alkoxide beads, and hollow glass beads, and organic spherical substances such as acrylic or vinylbenzene-based plastic beads.

Examples of the flame retardant include halogen flame retardants such as bromides, phosphorus flame retardants, silicon flame retardants, and metal hydrates such as magnesium hydroxide and aluminum hydroxide.

When the sheet containing these additives is used as an encapsulant placed on the side receiving sunlight of the solar cell element, transparency may be impaired. However, the sheet is suitable as an encapsulant placed on the side opposite to the light receiving side of the solar cell element.

In the invention, the total thickness of the sheet for solar cell encapsulant is preferably from 0.05 mm to 2 mm. When the total thickness of the sheet is 0.05 mm or more, breakage of the solar cell element caused by shock or the like is prevented, and when the total thickness is 2 mm or less, the sheet has transparency, receives a sufficient amount of sunlight, and maintains a high output.

The sheet for solar cell encapsulant of the invention may be molded by a known method using, for example, a T-die extruder, a calender molding machine, or an inflation molding machine.

For example, the above-described components (A) to (D), and additives such as an antioxidant, a light stabilizer, and an ultraviolet absorber are dry blended in advance, the mixture is fed from the hopper of an extruder, and obtained by extrusion molding into a sheet shape.

Alternatively, the components (A) and (B) are melt blended in advance, and then dry blended together with at least one of the component (C) or the component (D) and additives such as an antioxidant, a light stabilizer, and an ultraviolet absorber, and the mixture is fed from the hopper of an extruder, and obtained by extrusion molding into a sheet shape.

Alternatively, a master batch composed of the component (C) and additives such as an antioxidant, a light stabilizer, and an ultraviolet absorber may be prepared in advance, and added.

The processing temperature may be selected in the range of 120° C. to 250° C. in accordance with the processability of the component used.

[Solar Cell Module]

The solar cell module of the invention includes at least a substrate receiving sunlight, a solar cell element, and the sheet for solar cell encapsulant of the invention. The solar cell module of the invention may further include, as necessary, a protective material. The substrate receiving sunlight may be referred to simply as a substrate.

The solar cell module of the invention may be produced by fixing the solar cell element encapsulated by the sheet for solar cell encapsulant of the invention on the substrate.

Examples of the solar cell module include various types. For example, embodiment that the solar cell element is sandwiched between sheets for encapsulant, as expressed by substrate/sheet for encapsulant/solar cell element/sheet for encapsulant/protective material; embodiment that a solar cell element is formed on the surface of a glass substrate or the like, as expressed by substrate/solar cell element/sheet for encapsulant/protective material; embodiment that a solar cell element is formed on the inner side surface of a substrate, for example, an amorphous solar cell element is formed on a fluorocarbon resin sheet by sputtering or the like, on which a sheet for encapsulant and a protective material are formed.

When the substrate for receiving sunlight is positioned at the top of a solar cell module, the protective material is positioned opposite to the substrate, or at the bottom of the solar cell module. Therefore, the protective material may be referred to as lower protective material.

As the solar cell element, various solar cell elements such as silicon type such as single crystal silicon, polycrystalline silicon, and amorphous silicon and the like; and semiconductor type of Group III-V compounds or Group II-VI compounds such as gallium-arsenic, copper-indium-selenium, copper-indium-gallium-selenium, and cadmium-tellurium and the like, may be used. The sheet for encapsulant of the invention is particularly useful for the encapsulating the amorphous silicon solar cell elements.

Examples of the substrate composing the solar cell module include susbtrates of glass, acrylic resin, polycarbonate, polyester, and fluorine-containing resin.

The lower protective material is a sheet of a simple substance or multiple layers of metals or various thermoplastic resin films, and examples thereof include single-layer or multilayer sheets of inorganic materials including metals such as tin, aluminum and stainless steel, and glass; polyesters, inorganic material-deposited polyesters, fluorine-containing resins, and polyolefins. The sheet for solar cell encapsulant of the invention exhibits excellent adhesiveness to these substrates or protective materials.

In order to laminate and bond such the solar cell element, substrate, and protective material as described above together using the sheet for solar cell encapsulant of the invention, even if a crosslinking process based on pressure heating over a long time, which has been carried out for conventional ethylene-vinyl acetate copolymer systems, was not carried out, an adhesive strength that is capable of withstanding practical use, and long-term stability of the adhesive strength may be obtained. However, from the viewpoint of imparting a stronger adhesive strength or adhesive strength stability, it is recommended to apply a pressure heating treatment for a short time.

EXAMPLES

Hereinafter, the invention will be more specifically described with reference to Examples, but the invention is not limited to the following Examples as long as the gist is not departed.

Details of the components used for making the sheet for solar cell encapsulant are as follows.

<Component (A)>

(A-1) ethylene-1-hexene random copolymer: density 0.903 g/cm$^3$ (A-2) ethylene-α-olefin copolymer: density 0.902 g/cm$^3$ (trade name: EVOLUE SC00100, manufactured by Prime Polymer Co., Ltd.)

(A-3) ethylene-4-methyl-1-pentene random copolymer: density 0.902 g/cm$^3$ (A-4) ethylene-butene random copolymer: density 0.900 g/cm$^3$ (A-5) ethylene-vinyl acetate random copolymer (EVA): VA content 10% by mass (A-6) ethylene-vinyl acetate random copolymer (EVA): VA content 28% by mass (A-7) ethylene-1-hexene random copolymer: density 0.895 g/cm$^3$ The notation "VA" represents vinyl acetate.

The physical properties of the from A-1 to A-7 are shown in Table 1. In Table 1, the melting point was measured by DSC as defined in JIS K 7121, and expressed in units of [° C.]; the density was measured by the method defined in JIS K 7112, and expressed in units of [g/cm$^3$]; the MFR was measured at 190° C., under a load of 2160 g by the method defined in JIS K 7210, and expressed in units of [g/10 minutes]. The VA content is expressed in units of [% by mass], and represents the content in the respective copolymers.

TABLE 1

| | Content | Melting point | Density | MFR | VA content |
|---|---|---|---|---|---|
| A-1 | Ethylene-1-hexene copolymer | 98 | 0.903 | 3.8 | — |
| A-2 | Ethylene-α-olefin copolymer | 103 | 0.902 | 7.3 | — |
| A-3 | Ethylene-4-methyl-1-pentene copolymer | 115 | 0.902 | 2.0 | — |
| A-4 | Ethylene-butene copolymer | 85 | 0.900 | 3.6 | — |
| A-5 | Ethylene-VA copolymer | 94 | 0.930 | 9.0 | 10 |
| A-6 | Ethylene-VA copolymer | 71 | 0.950 | 15.0 | 28 |
| A-7 | Ethylene-1-hexene copolymer | 90 | 0.895 | 3.5 | — |

<Component (B)>

(B-1) ethylene-glycidyl methacrylate-vinyl acetate copolymer (EGMAVA)

trade name: BONDFAST 7B, manufactured by Sumitomo Chemical Co., Ltd.

(B-2) ethylene-glycidyl methacrylate copolymer (EGMA)

trade name: BONDFAST E, manufactured by Sumitomo Chemical Co., Ltd.

The physical properties of the B-1 and B-2 are shown in Table 2. In Table 2, the melting point is expressed in units of [° C.], the density is expressed in units of [g/cm$^3$], and the MFR is expressed in units of [g/10 minutes]. The GMA content and VA content are expressed in units of [% by mass], and represent the content in the respective copolymers.

TABLE 2

| Content | Melting point | GMA content | VA content | Density | MFR |
|---|---|---|---|---|---|
| B-1 Ethylene-GMA-VA copolymer | 95 | 12 | 5 | 0.95 | 7 |
| B-2 Ethylene-GMA copolymer | 103 | 12 | — | 0.94 | 3 |

<Component (C)>

(C-1)

a Silane Modified Ethylene-α-Olefin Copolymer Prepared by Mixing 100 Parts by mass of (A-4), 2 parts by mass of vinyltrimethoxysilane, and 0.1 parts by mass of free radical generator (2,5-dimethyl-2,5-di(t-butyl peroxy)hexane), followed by graft copolymerization in a single-screw extruder at a melting temperature of 220° C.

(C-2)

a Silane Modified Eva Copolymer Prepared by Mixing 100 Parts by Mass of (A-5), 2 parts by mass of vinyltrimethoxysilane, and 0.1 parts by mass of free radical generator (2,5-dimethyl-2,5-di(t-butyl peroxy)hexane), followed by graft copolymerization in a single-screw extruder at a melting temperature of 220° C.

(C-3)

Modified Silane Prepared by Mixing 50 Parts by Mass of (A-7), 50 Parts by Mass of (B-2), 2.5 parts by mass of vinyltrimethoxysilane, and 0.1 parts by mass of free radical generator (2,5-dimethyl-2,5-di(t-butyl peroxy) hexane), followed by graft copolymerization in a single-screw extruder at a melting temperature of 220° C.

(C-4)

A Silane Modified Ethylene-1-Hexene Copolymer Prepared by Mixing 100 Parts by mass of (A-7), 2.5 parts by mass of vinyltrimethoxysilane, and 0.1 parts by mass of free radical generator (2,5-dimethyl-2,5-di(t-butyl peroxy) hexane), followed by graft copolymerization in an single-screw extruder at a melting temperature of 220° C.

(C-5)

Modified Silane Prepared by Mixing 50 Parts by Mass of (A-6), 50 Parts by Mass of (B-1), 2 parts by mass of γ-methacryloxypropyltrimethoxysilane, and 0.1 parts by mass of free radical generator (2,5-dimethyl-2,5-di(t-butyl peroxy) hexane), followed by graft copolymerization in a single-screw extruder at a melting temperature of 220° C.

<Component (D)>
(D-1) silane coupling agent:
N-2(aminoethyl)-3-aminopropyl dimethoxysilane
(D-2) silane coupling agent:
γ-methacryloxypropyltrimethoxysilane
<Various Additives (E)>
(E-1) ultraviolet absorber (trade name: UVINUL3039, manufactured by BASF SE)
(E-2) light stabilizer (trade name: UVINUL5050H, manufactured by BASF SE)
(E-3) antioxidant (trade name: IRGANOX 1010, manufactured by BASF Japan Ltd.)
<Crosslinking Agent (F)>
(F-1) crosslinking agent: 2,5-dimethyl-2,5-di(t-butylperoxy)hexane
(F-2) crosslinking agent: t-butylperoxy-2-ethylhexyl carbonate Example 1

90 parts by mass of (A-1) and 10 parts by mass of (B-1) were melt blended in advance at a processing temperature of 150° C. (single-screw extruder with 40 mm diameter, L/D=28, equipped with a Dulmadge screw, 40 rpm).

Subsequently, 0.12 parts by mass of the ultraviolet absorber (E-1), 0.06 parts by mass of the light stabilizer (E-2), 0.03 parts by mass of the antioxidant (E-3) were added. A sheet for encapsulant with 0.4 mm thick was made from the mixture using a single-screw T-die molding machine with 40 mm diameter at a resin temperature of 140° C.

(Evaluation)

Using the sheets for encapsulant obtained above, and the following substrate, the following back sheet (protective material), and the following laminator, the evaluations of adhesion to glass and back sheet, and lamination properties were carried out by the following methods (1) to (3). The evaluation results are shown in Table 3.

<Substrate>
Material: float glass (Blue plate glass)
Thickness: 3.2 mm
Size: 7.5 cm×12 cm
<Back Sheet (Protective Material)>
Material: white PET (100 μm)/aluminum (90 μm)/transparent PET (50 μm)
Total thickness: 240 μm
The transparent PET film was subjected to corona treatment.

<Pet without Corona Treatment>
Material: PET (polyethylene terephthalate), manufactured by Unitika, Ltd.
Thickness: 100 μm
<Laminator>
Trade name: LM-50×50S, manufactured by NPC Corp.
—(1) Adhesion to Glass—

The sheet for encapsulant prepared with a T-die molding machine was mounted on glass, and these components were laminated by a laminator at 150° C. for 6 minutes. The structure of the sample is expressed by "substrate (glass)/sheet for encapsulant". The adhesion of the sheet for encapsulant to glass was evaluated by pulling an edge of the resin layer for encapsulant in a strip of the sample having a width of 15 mm at a pulling speed of 100 mm/minute in a direction perpendicular to the glass surface. The measurements are listed in Table 3. The adhesive strength of 10 N/15 mm or more, particularly 15 N/15 mm or more indicates high adhesion.

—(2) Adhesion to Back Sheet—

The sheet for encapsulant prepared with a T-die molding machine was mounted on glass, a back sheet was mounted on the sheet for encapsulant, and these components were laminated using a laminator at 150° C. for 6 minutes. The corona-treated surface of the back sheet was bonded to the sheet for encapsulant. The structure of the sample is expressed as "substrate (glass)/sheet for encapsulant/back sheet".

The adhesion of the sheet for encapsulant to the back sheet was evaluated by pulling an edge of the back sheet in a strip of the sample having a width of 15 mm at a pulling speed of 100 mm/minute in a direction perpendicular to the sheet for encapsulant/glass surface. The measurements are listed in Table 3. The adhesive strength of 15 N/15 mm or more indicates high adhesion.

—(3) Lamination Properties—

A lattice pattern was drawn with a black marker on the sheet for encapsulant made using a T-die molding machine, and the sheet for encapsulant (thickness: 400 μm), and back sheet (PET) were mounted in this order on a piece of glass 250 mm square, and laminated using a laminator at 150° C. for 6 minutes. The structure of the sample is expressed as "substrate (glass)/sheet for encapsulant/back sheet (PET)".

The sample thus obtained was visually observed for the presence or absence of discharge from edges. Those having small discharge were rated as O, and large overflow as x.

Example 2

80 parts by mass of (A-1), 20 parts by mass of (B-1) were melt blended in advance at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), 0.03 parts by mass of the antioxidant (E-3) were added. A sheet for encapsulant with 0.4 mm thick was made from the mixture using a single-screw T-die molding machine with 40 mm diameter at a resin temperature of 140° C. The sheet for encapsulant was subjected to the evaluations of adhesion to glass and back sheet, and lamination properties in the same manner as in Example 1. The results are shown in Table 3.

Example 3

80 parts by mass of (A-5) and 20 parts by mass of (B-1) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass and back sheet, and lamination properties in the same manner as in Example 1. The results are shown in Table 3.

Example 4

80 parts by mass of (A-1) and 20 parts by mass of (B-2) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass and back sheet, and lamination properties in the same manner as in Example 1. The results are shown in Table 3.

Example 5

80 parts by mass of (A-1), 10 parts by mass of (B-1), and 10 parts by mass of (C-1) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass and back sheet, and lamination properties in the same manner as in Example 1. In addition, the sheet was exposed to moisture resistance condition (Damp Heat Condition) (85° C., 90% RH) for 1000 hours by the below-described method, and then measured for the adhesion to glass and back sheet. The results are shown in Tables 3 and 4.

Example 6

80 parts by mass of (A-1), 10 parts by mass of (B-1), and 10 parts by mass of (C-2) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass and back sheet, and lamination properties in the same manner as in Example 1. In addition, the sheet was exposed to moisture resistance condition (Damp Heat Condition) (85° C., 90% RH) for 1000 hours by the same method as in Example 5, and then measured for the adhesion to glass and back sheet. The results are shown in Tables 3 and 4.

Example 7

80 parts by mass of (A-1) and 20 parts by mass of (C-3) were melt blend at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), and 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass and back sheet, and lamination properties in the same manner as in Example 1, and subjected to the evaluations of adhesion to PET by the below-described method. The results are shown in Tables 3 to 5.

The component (B) was added not alone, but added during making the component (C-3), and the resin composition finally obtained contained the component (B).

—(4) Evaluation of Adhesion to PET—

The sheet for encapsulant made using a T-die molding machine was mounted on glass, and then PET (100 μm thick, manufactured by Unitika, Ltd.), which had not been subjected to corona treatment, was mounted on the sheet for encapsulant, and these components were laminated by a laminator at 150° C. for 6 minutes. The structure of the sample is expressed by "substrate (glass)/sheet for encapsulant/PET".

The adhesion of the sheet for encapsulant to PET was evaluated by pulling an edge of PET in a strip of the sample having a width of 15 mm at a pulling speed of 100 mm/minute in a direction perpendicular to the sheet for encapsulant/glass surface.

The measurements are listed in Table 5. The adhesive strength of 15 N/15 mm or more indicates high adhesion.

Example 8

60 parts by mass of (A-1) and 40 parts by mass of (C-3) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), and 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass, PET, and back sheet, and lamination properties in the same manner as in Examples 1 and 7. The results are shown in Tables 3 to 5.

The component (B) was added not alone, but added during making the component (C-3), and the resin composition finally obtained contained the component (B).

Example 9

80 parts by mass of (A-1), 10 parts by mass of (B-2), and 10 parts by mass of (C-4) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), and 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass, PET, and back sheet, and lamination properties in the same manner as in Example 1 and 7. The results are shown in Tables 3 to 5

Example 10

70 parts by mass of (A-1), 20 parts by mass of (B-2), and 10 parts by mass of (C-4) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), and 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass, PET, and back sheet, and lamination properties in the same manner as in Examples 1 and 7. The results are shown in Tables 3 and 5.

Example 11

70 parts by mass of (A-1), 20 parts by mass of (B-1), and 10 parts by mass of (C-4) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), and 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass, PET, and back sheet, and lamination properties in the same manner as in Examples 1 and 7. The results are shown in Tables 3 and 5.

Example 12

80 parts by mass of (A-2) and 20 parts by mass of (C-5) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), and 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass and back sheet, and lamination properties in the same manner as in Example 1. The results are shown in Table 3.

The component (B) was added not alone, but added during making the component (C-5), and the resin composition finally obtained contained the component (B)

Example 13

80 parts by mass of (A-3), 20 parts by mass of (C-5) were melt blended at a processing temperature of 150° C. (single-screw extruder with 40 mm diameter, L/D=28, equipped with a Dulmadge screw, 40 rpm). Subsequently, 0.12 parts by mass of the ultraviolet absorber (E-1), 0.06 parts by mass of the light stabilizer (E-2), and 0.03 parts by mass of the antioxidant (E-3) were added. A sheet for encapsulant with 0.4 mm thick was made from the mixture using a single-screw T-die molding machine with 40 mm diameter at a resin temperature of 140° C.

The sheet for encapsulant was subjected to the evaluations of adhesion to glass and back sheet, and lamination properties in the same manner as in Example 1. The results are shown in Table 3.

The component (B) was added not alone, but added during making the component (C-5), and the resin composition finally obtained contained the component (B).

Comparative Example 1

100 parts by mass of (A-6), 0.2 parts by mass of (D-1), 0.1 parts by mass of the crosslinking agent (F-1), 0.2 parts by mass of the crosslinking agent (F-2), 0.3 parts by mass of the ultraviolet absorber (E-1), 0.1 parts by mass of the light stabilizer (E-2), and 0.02 parts by mass of the antioxidant (E-3) were mixed. A sheet for encapsulant with 0.4 mm thick was made from the mixture using a single-screw T-die molding machine with 40 mm diameter, at a resin temperature of 100° C.

The sheet for encapsulant was subjected to the evaluations of adhesion to glass and back sheet, and lamination properties in the same manner as in Example 1. The results are shown in Table 3.

Comparative Example 2

100 parts by mass of (A-6), 0.2 parts by mass of (D-2), 0.1 parts by mass of the crosslinking agent (F-1), 0.2 parts by mass of the crosslinking agent (F-2), 0.3 parts by mass of the ultraviolet absorber (E-1), 0.1 parts by mass of the light stabilizer (E-2), and 0.02 parts by mass of the antioxidant (E-3) were mixed. A sheet for encapsulant with 0.4 mm thick was made from the mixture using a single-screw T-die molding machine with 40 mm diameter, at a resin temperature of 100° C.

The sheet for encapsulant was subjected to the evaluations of adhesion to glass and back sheet, and lamination properties in the same manner as in Example 1, except that after laminating to glass or back sheet by a laminator as in Example 1, curing (heat treatment) in an oven at 145° C. for 40 minutes was carried. The results are shown in Table 3.

In the following Tables 3 to 5, the melting point is expressed in units of [° C.], and the GMA content is expressed in units of [% by mass].

TABLE 3

| | Component (A) | | Component (B) | | (C), (D) Type | Heat treatment | Adhesive strength [N/15 mm] | | Lamination properties |
|---|---|---|---|---|---|---|---|---|---|
| | Type | Melting point | Type | GMA content | | | To glass | To back sheet | |
| Example 1 | A-1 | 98 | B-1 | 12 | None | None | 44 | 55 | O |
| Example 2 | A-1 | 98 | B-1 | 12 | None | None | 43 | 59 | O |
| Example 3 | A-5 | 94 | B-1 | 12 | None | None | 33 | 31 | O |
| Example 4 | A-1 | 98 | B-2 | 12 | None | None | 40 | 50 | O |
| Example 5 | A-1 | 98 | B-1 | 12 | C-1 | None | 41 | 36 | O |
| Example 6 | A-1 | 98 | B-1 | 12 | C-2 | None | 44 | 55 | O |
| Example 7 | A-1 | 98 | B-2 | 12 | C-3 | None | 39 | 41 | O |
| Example 8 | A-1 | 98 | B-2 | 12 | C-3 | None | 41 | 24 | O |
| Example 9 | A-1 | 98 | B-2 | 12 | C-4 | None | 41 | 37 | O |
| Example 10 | A-1 | 98 | B-2 | 12 | C-4 | None | 41 | 36 | O |
| Example 11 | A-1 | 98 | B-1 | 12 | C-4 | None | 41 | 30 | O |
| Example 12 | A-2 | 103 | B-1 | 12 | C-5 | None | 39 | 59 | O |
| Example 13 | A-3 | 115 | B-1 | 12 | C-5 | None | 46 | 81 | O |
| Comparative Example 1 | A-6 | 71 | None | — | D-1 | None | 12 | 8 | x |
| Comparative Example 2 | A-6 | 71 | None | — | D-2 | Treated | 42 | 67 | x |

TABLE 4

| | Component (A) | | Component (B) | | (C), (D) Type | Heat treatment | Adhesive strength [N/15 mm] Initial value → After 1000 hours of exposure to moisture resistance condition (Damp Heat Condition) | |
|---|---|---|---|---|---|---|---|---|
| | Type | Melting point | Type | GMA content | | | To glass | To back sheet |
| Example 5 | A-1 | 98 | B-1 | 12 | C-1 | None | 41→broken | 36→broken |
| Example 6 | A-1 | 98 | B-1 | 12 | C-2 | None | 44→broken | 60→broken |
| Example 7 | A-1 | 98 | B-2 | 12 | C-3 | None | 39→48 | 41→broken |
| Example 8 | A-1 | 98 | B-2 | 12 | C-3 | None | 41→51 | 24→broken |
| Example 9 | A-1 | 98 | B-2 | 12 | C-4 | None | 41→21 | 37→broken |

TABLE 5

| | Component (A) | | Component (B) | | (C), (D) Type | Heat treatment | Adhesive strength [N/15 mm] To PET |
|---|---|---|---|---|---|---|---|
| | Type | Melting point | Type | GMA content | | | |
| Example 7 | A-1 | 98 | B-2 | 12 | C-3 | None | 20→broken |
| Example 8 | A-1 | 98 | B-2 | 12 | C-3 | None | 24→broken |
| Example 9 | A-1 | 98 | B-2 | 12 | C-4 | None | 18→broken |
| Example 10 | A-1 | 98 | B-2 | 12 | C-4 | None | 21→broken |
| Example 11 | A-1 | 98 | B-1 | 12 | C-4 | None | 19→broken |

As shown in Tables 3 to 5, the sheets for encapsulant of the respective examples showed high adhesion to glass and back sheet.

The entire disclosure of Japanese Patent Application No. 2009-116857 is incorporated herein into this specification by reference.

All documents, patent applications and technical specifications recited in this specification are incorporated herein by reference in this specification to the same extent as if each individual publication, patent applications and technical standard was specifically and individually indicated to be incorporated by reference.

The invention claimed is:

1. A sheet for a solar cell encapsulant consisting of:
at least one ethylene copolymer (A) selected from the group consisting of the following (1a) to (4a), the ethylene copolymer (A) having a melting point of 90° C. or higher and containing a constituent unit derived from ethylene:
(1a) an ethylene-vinyl acetate copolymer wherein a content ratio of a constituent unit derived from vinyl acetate is 15% by mass or less;
(2a) an ethylene-acrylate copolymer wherein a content ratio of a constituent unit derived from acrylate is 15% by mass or less;

(3a) a high-pressure method low-density polyethylene; and
(4a) an ethylene-α-olefin copolymer having a density of 0.895 g/cm³ or more;
at least one ethylene copolymer (B) selected from the group consisting of the following (1 b) to (3b):
(1b) an ethylene-glycidyl (meth)acrylate copolymer;
(2b) an ethylene-vinyl acetate-glycidyl (meth)acrylate copolymer wherein a content ratio of a constituent unit derived from vinyl acetate is 30% by mass or less; and
(3b) an ethylene-acrylate-glycidyl (meth)acrylate copolymer wherein a content ratio of a constituent unit derived from acrylate is 30% by mass or less;
optionally a copolymer (C) obtained by copolymerization of at least α-olefin and an ethylenically unsaturated silane compound;
optionally a silane coupling agent (D); and
optionally an ultraviolet absorber, a light stabilizer, an antioxidant, or combinations thereof.

2. The sheet for a solar cell encapsulant according to claim 1, wherein the ethylene copolymer (A) and the ethylene copolymer (B) have a melt flow rate (JIS K7210-1999, 190° C., load of 2160 g) of from 0.1 g/10 minutes to 50 g/10 minutes.

3. The sheet for a solar cell encapsulant according to claim 1 consisting of:
the ethylene copolymer (A);
the ethylene copolymer (B);
the copolymer (C); and
optionally the ultraviolet absorber, the light stabilizer, the antioxidant, or combinations thereof.

4. The sheet for a solar cell encapsulant according to claim 1 consisting of:
the ethylene copolymer (A);
the ethylene copolymer (B);
the silane coupling agent (D); and
optionally the ultraviolet absorber, the light stabilizer, the antioxidant, or combinations thereof.

5. The sheet for a solar cell encapsulant according to claim 1 consisting of:
the ethylene copolymer (A);
the ethylene copolymer (B);
the copolymer (C); and
the silane coupling agent (D); and
optionally the ultraviolet absorber, the light stabilizer, the antioxidant, or combinations thereof.

6. The sheet for a solar cell encapsulant according to claim 3, wherein the copolymer (C) further comprises a constituent unit derived from at least one of vinyl acetate or acrylate.

7. The sheet for a solar cell encapsulant according to claim 1, wherein the ethylene-α-olefin copolymer (4a) of the ethylene copolymer (A) is an ethylene-propylene copolymer, an ethylene-1-butene copolymer, an ethylene-4-methyl-1-pentene copolymer, or an ethylene-1-hexene copolymer.

8. The sheet for a solar cell encapsulant according to claim 3, wherein the α-olefin of the copolymer (C) is at least one of ethylene, propylene, 1-butene, isobutylene, 1-pentene, 2-methyl-1-butene, 3-methyl-1-butene, 1-hexene, 1-heptene, 1-octene, 1-nonene, or 1-decene.

9. The sheet for a solar cell encapsulant according to claim 3, wherein the ethylenically unsaturated silane compound is selected from vinylsilane and (meth)acryloxysilane.

10. The sheet for a solar cell encapsulant according to claim 3, wherein the ethylenically unsaturated silane compound is vinyltrimethoxysilane or γ-methacryloxypropyltrimethoxysilane.

11. A solar cell module comprising at least a substrate at which sunlight is incident, a solar cell element, and the sheet for a solar cell encapsulant according to claim 1.

12. The sheet for a solar cell encapsulant according to claim 1, wherein the ethylene-α-olefin copolymer (4a) of the ethylene copolymer (A) is an ethylene-1-butene copolymer, an ethylene-4-methyl-1-pentene copolymer, or an ethylene-1-hexene copolymer.

13. The sheet for a solar cell encapsulant according to claim 1, wherein the ethylene-α-olefin copolymer (4a) of the ethylene copolymer (A) is an ethylene-1-butene copolymer.

14. The sheet for a solar cell encapsulant according to claim 1, wherein the ethylene-α-olefin copolymer (4a) of the ethylene copolymer (A) is an ethylene-4-methyl-1-pentene copolymer.

15. The sheet for a solar cell encapsulant according to claim 1, wherein the ethylene-α-olefin copolymer (4a) of the ethylene copolymer (A) is an ethylene-1-hexene copolymer.

16. The sheet for a solar cell encapsulant according to claim 1, wherein the ethylene copolymer (A) is the ethylene-vinyl acetate copolymer (1a) and the ethylene copolymer (A) optionally further comprises one or more selected from the group consisting of the following (2a) to (4a):
(2a) the ethylene-acrylate copolymer;
(3a) the high-pressure method low-density polyethylene; and
(4a) the ethylene-α-olefin copolymer.

17. The sheet for a solar cell encapsulant according to claim 1, wherein the ethylene copolymer (A) is the ethylene-acrylate copolymer (2a) and the ethylene copolymer (A) optionally further comprises one or more selected from the group consisting of the following (1a), (3a), and (4a):
(1a) the ethylene-vinyl acetate copolymer;
(3a) the high-pressure method low-density polyethylene; and
(4a) the ethylene-α-olefin copolymer.

18. The sheet for a solar cell encapsulant according to claim 1, wherein the ethylene copolymer (B) is the ethylene-vinyl acetate-glycidyl (meth)acrylate copolymer (2b) and the ethylene copolymer (B) optionally further comprises one or more selected from the group consisting of the following (1 b) and (3b):
(1 b) the ethylene-glycidyl (meth)acrylate copolymer; and
(3b) the ethylene-acrylate-glycidyl (meth)acrylate copolymer.

19. The sheet for a solar cell encapsulant according to claim 1, wherein the ethylene copolymer (B) is the ethylene-acrylate-glycidyl (meth)acrylate copolymer (3b) and the ethylene copolymer (B) optionally further comprises one or more selected from the group consisting of the following (1 b) and (2b):
(1 b) the ethylene-glycidyl (meth)acrylate copolymer; and
(2b) the ethylene-vinyl acetate-glycidyl (meth)acrylate copolymer.

20. The sheet for a solar cell encapsulant according to claim 1, wherein the ethylene copolymer (B) is selected from the group consisting of the following (2b) and (3b):
(2b) the ethylene-vinyl acetate-glycidyl (meth)acrylate copolymer; and
(3b) the ethylene-acrylate-glycidyl (meth)acrylate copolymer.

* * * * *